US012183398B2

(12) United States Patent
Hara

(10) Patent No.: US 12,183,398 B2
(45) Date of Patent: Dec. 31, 2024

(54) MEMORY SYSTEM WITH SEMICONDUCTOR STORAGE DEVICE AND MEMORY CONTROLLER FOR PERFORMING READ VERIFICATION

(71) Applicant: Kioxia Corporation, Tokyo (JP)

(72) Inventor: Keigo Hara, Kamakura Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 135 days.

(21) Appl. No.: 17/897,695

(22) Filed: Aug. 29, 2022

(65) Prior Publication Data

US 2023/0197159 A1 Jun. 22, 2023

(30) Foreign Application Priority Data

Dec. 16, 2021 (JP) .................. 2021-204259

(51) Int. Cl.
*G11C 16/34* (2006.01)
*G11C 16/10* (2006.01)
*G11C 16/26* (2006.01)

(52) U.S. Cl.
CPC .............. *G11C 16/10* (2013.01); *G11C 16/26* (2013.01); *G11C 16/3459* (2013.01)

(58) Field of Classification Search
None
See application file for complete search history.

(56) References Cited

U.S. PATENT DOCUMENTS

| 10,049,759 B2 | 8/2018 | Kavalipurapu et al. |
| 10,395,739 B2 | 8/2019 | Kondo |
| 11,049,578 B1 | 6/2021 | Murai et al. |
| 2008/0049529 A1 | 2/2008 | Ohsawa |
| 2011/0310666 A1 | 12/2011 | Miida et al. |
| 2012/0239984 A1 | 9/2012 | Fujita |
| 2012/0287710 A1 | 11/2012 | Shirakawa |
| 2013/0077409 A1* | 3/2013 | Shiino ................ G11C 16/3459 365/185.22 |
| 2015/0262682 A1 | 9/2015 | Futatsuyama et al. |
| 2016/0078948 A1 | 3/2016 | Shirakawa |
| 2021/0074355 A1 | 3/2021 | Tsukamoto et al. |

FOREIGN PATENT DOCUMENTS

| JP | 2018-163727 A | 10/2018 |
| TW | 200828308 A | 7/2008 |
| TW | 201106357 A | 2/2011 |
| TW | 201631590 A | 9/2016 |
| TW | 1604452 B | 11/2017 |
| TW | 202111712 A | 3/2021 |

* cited by examiner

*Primary Examiner* — Alfredo Bermudez Lozada
(74) *Attorney, Agent, or Firm* — Foley & Lardner LLP

(57) ABSTRACT

A memory system includes a memory controller and a semiconductor storage device. The semiconductor storage device performs a program operation of performing a software program loop including applying a write voltage to a word line, performing program verification for performing write determination of a first data value, and increasing a set value of the write voltage if determining that writing of the first data value is not completed, and generates an index based on first information obtained according to a progress of writing the first data value in the program operation. The memory controller determines whether to perform read verification of reading data from the plurality of memory cells based on the index.

18 Claims, 10 Drawing Sheets

FIG. 6
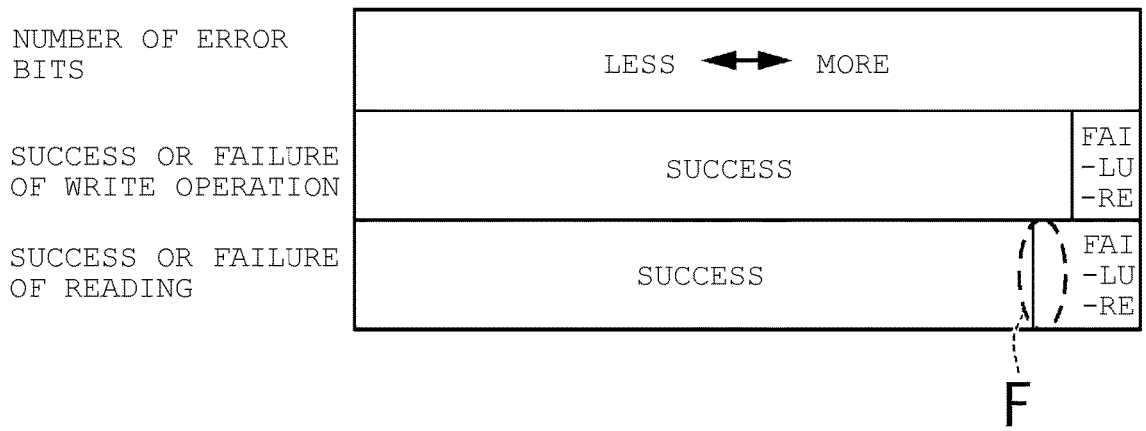
FIG. 7
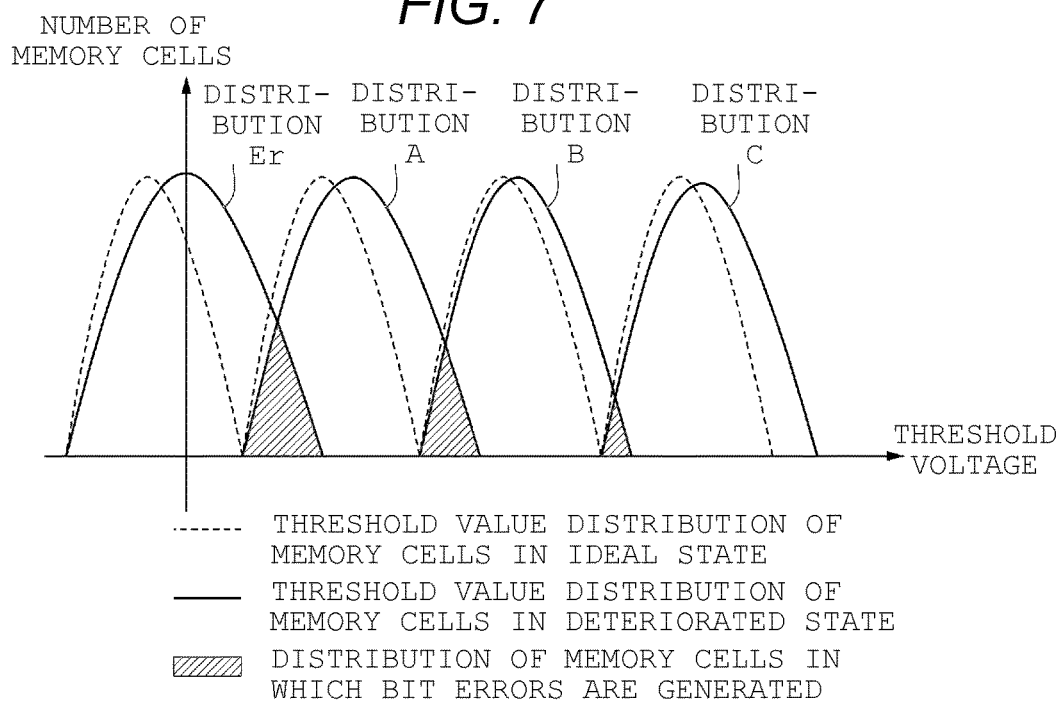
FIG. 8
| | | DISTRIBUTION A | DISTRIBUTION B | DISTRIBUTION C |
|---|---|---|---|---|
| VPS RANGE | Min | 3 | 5 | 7 |
| | Max | 4 | 6 | 8 |
| VPS COUNT | | 6000 | 12000 | 18000 |

| | | DISTRIBUTION A | DISTRIBUTION B | DISTRIBUTION C |
|---|---|---|---|---|
| VPS RANGE | Min | 3 | 5 | 7 |
| | Max | 4 | 6 | 8 |
| VPS COUNT | | 6000 | 12000 | 18000 |

| | | DISTRIBUTION A | DISTRIBUTION B | DISTRIBUTION C |
|---|---|---|---|---|
| VPS RANGE | Min | 4 | 6 | 8 |
| | Max | 5 | 7 | 9 |
| VPS COUNT | | 6500 | 12500 | 18500 |

| | | DISTRIBUTION A | DISTRIBUTION B | DISTRIBUTION C |
|---|---|---|---|---|
| VPS RANGE | Min | 5 | 7 | 8 |
| | Max | 6 | 8 | 10 |
| VPS COUNT | | 7000 | 13000 | 19000 |

| | | DISTRIBUTION A | DISTRIBUTION B | DISTRIBUTION C |
|---|---|---|---|---|
| VPS RANGE | Min | 3 | 5 | 7 |
| | Max | 4 | 6 | 8 |
| VPS COUNT | | 6000 | 12000 | 18000 |

| | | DISTRIBUTION A | DISTRIBUTION B | DISTRIBUTION C |
|---|---|---|---|---|
| VPS RANGE | Min | 4 | 6 | 8 |
| | Max | 5 | 7 | 9 |
| VPS COUNT | | 6500 | 12500 | 18500 |

MEMORY SYSTEM WITH SEMICONDUCTOR STORAGE DEVICE AND MEMORY CONTROLLER FOR PERFORMING READ VERIFICATION

CROSS-REFERENCE TO RELATED APPLICATION

This application is based upon and claims the benefit of priority from Japanese Patent Application No. 2021-204259, filed Dec. 16, 2021, the entire contents of which are incorporated herein by reference.

FIELD

Embodiments described herein relate generally to a memory system and a semiconductor storage device.

BACKGROUND

In general, a memory system includes a memory controller and a semiconductor storage device. The memory controller can perform a program operation with respect to a write command received from the memory controller.

DESCRIPTION OF THE DRAWINGS

FIG. 6 is a diagram showing a read verification according to the first embodiment.

FIG. 7 is a diagram showing a deviation of a threshold voltage distribution of the memory cell according to the first embodiment.

FIG. 8 is a diagram showing an example of a VPS range count table according to the first embodiment.

FIGS. 11A, 11B, and 11C are each a diagram showing an example of a VPS range count table of a second embodiment.

FIGS. 12A and 12B are each a diagram showing an example of a VPS range count table according to a third embodiment.

DETAILED DESCRIPTION

Figure 1:
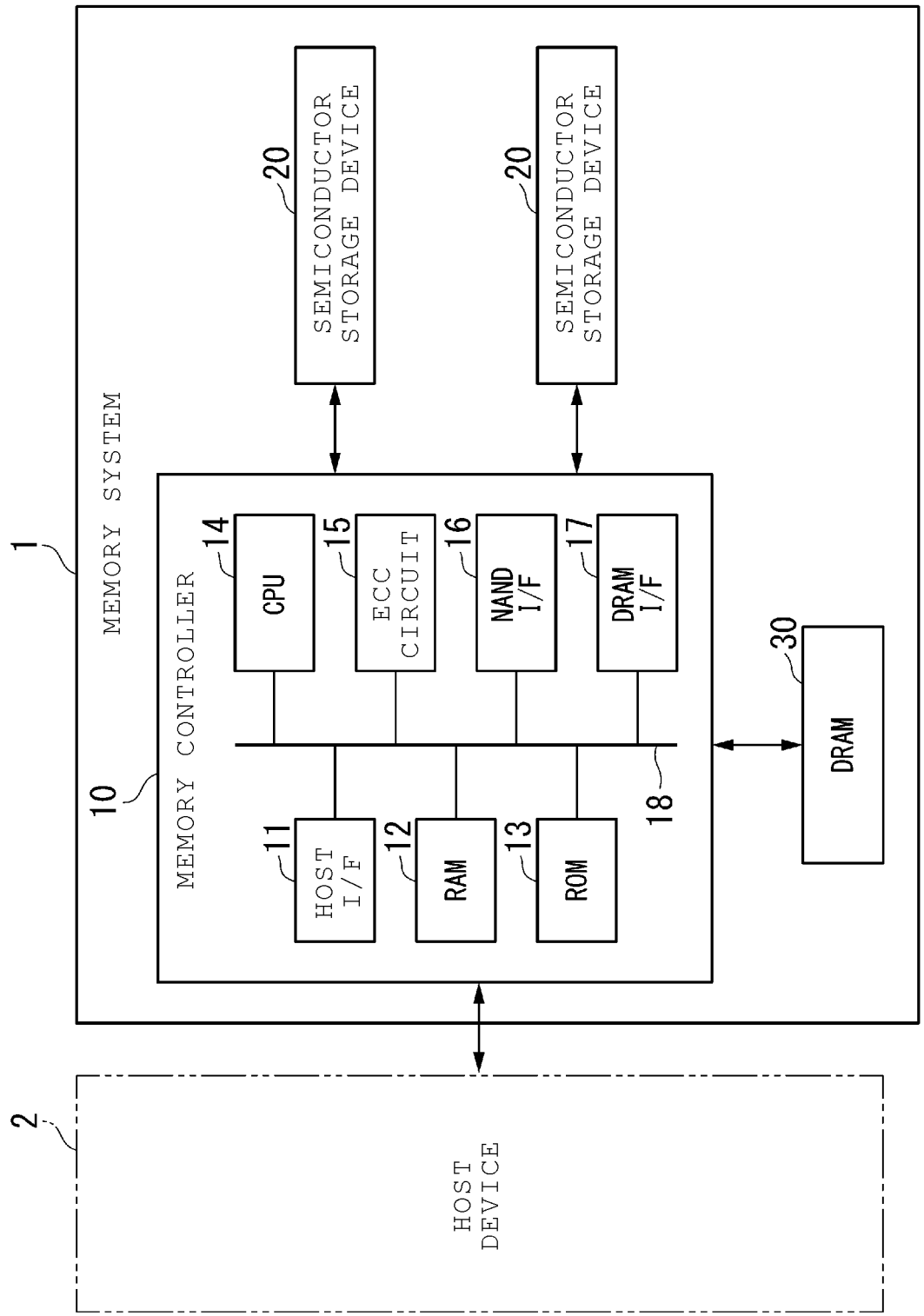
FIG. 1 is a block diagram showing a configuration of a memory system according to a first embodiment.

Embodiments provide a memory system that can control a semiconductor storage device better, and a semiconductor storage device.

In general, according to one embodiment, a memory system includes a memory controller and a semiconductor storage device. The semiconductor storage device includes a plurality of memory cells. If data is written to the plurality of memory cells, the memory controller transmits a write command to the semiconductor storage device. With respect to the write command, the semiconductor storage device is configured to: perform a program operation including performing a first software program loop until a first predetermined condition is satisfied, wherein the first software program loop includes applying a write voltage to a word line, applying a first verification voltage to the word line to perform program verification for performing write determination of a first data value provided in the data, and increasing a set value of the write voltage if determining that writing of the first data value is not completed; and generate an index based on first information obtained according to a progress of writing the first data value in the program operation. The memory controller is configured to determine whether to perform read verification of reading data from the plurality of memory cells based on the index.

Hereinafter, a memory system and a semiconductor storage device according to embodiments are described with reference to drawings. In the following description, configurations having the same or similar functions are denoted by the same reference numerals. Then, the duplicate description of those configurations may be omitted. The expression "based on XX" means "at least based on XX", and may include a case of being based on another element in addition to XX. Further, the expression "based on XX" is not limited to a case of directly using XX and may include a case of being based on those obtained by calculating or processing XX. "XX" is any element (for example, any information). "Connection" is not limited to a mechanical connection and may include an electrical connection. That is, the "connection" is not limited to a case of being directly connected to an object and may include a case of being connected to each other with another element interposed therebetween.

First Embodiment

1. Overall Configuration of Memory System

FIG. 1 is a block diagram showing a configuration of a memory system 1 according to the first embodiment. For example, the memory system 1 is a storage device such as a Solid State Drive (SSD). The memory system 1 communicates with an external host device 2 and performs various operations according to a request from the host device 2.

The memory system 1 includes, for example, a memory controller 10, one or more semiconductor storage devices 20, and one or more dynamic random access memories (DRAMs) 30.

Memory Controller

The memory controller 10 is a controller that controls the memory system 1. For example, the memory controller 10 controls operations relating to writing, reading, and erasing data with respect to the semiconductor storage device 20 according to the request from the host device 2.

The memory controller 10 includes, for example, a host interface circuit (hereinafter, referred to as a host I/F) 11, a random access memory (RAM) 12, a read only memory (ROM) 13, a central processing unit (CPU) 14, an error check and correct (ECC) circuit 15, a NAND interface circuit (hereinafter, referred to as a "NAND I/F") 16, and a DRAM interface circuit (hereinafter, referred to as a "DRAM I/F") 17. These configurations are connected to each other via a bus 18. The memory controller 10 is a system on a chip (SoC) obtained by collecting these configurations in one chip. However, a part of these configurations may be provided outside of the memory controller 10.

The host I/F 11 is connected to the host device 2. The host I/F 11 performs data transmission between the host device 2 and the memory controller 10 under the control of the CPU 14. The RAM 12 is a volatile storage unit. The RAM 12 provides a work area to the CPU 14. Firmware (a program) from the ROM 13 is loaded onto the RAM 12 during the operation of the memory system 1. The CPU 14 is an example of a hardware processor. The CPU 14 controls the operation of the memory controller 10 by executing the firmware loaded onto the RAM 12.

The ECC circuit 15 encodes data to be written to the semiconductor storage device 20 (hereinafter, referred to as "write data") for error correction. If an error is provided in data read from the semiconductor storage device 20 (hereinafter, referred to as "read data"), the ECC circuit 15 performs error correction with respect to the read data based on an error correction code placed during the write operation.

The NAND I/F 16 is connected to the semiconductor storage device 20. The NAND I/F 16 performs data transmission between the memory controller 10 and the semiconductor storage device 20 under the control of the CPU 14. The DRAM I/F 17 is connected to the DRAM 30. The DRAM I/F 17 performs data transmission between the memory controller 10 and the DRAM 30 under the control of the CPU 14.

Semiconductor Storage Device

The semiconductor storage device 20 is a nonvolatile semiconductor storage device. The semiconductor storage device 20 is, for example, a NAND-type flash memory. The semiconductor storage device 20 is specifically described below.

DRAM

The DRAM 30 is a volatile semiconductor storage device. The DRAM 30 functions as a data buffer for data transmission between the host device 2 and the semiconductor storage device 20. For example, the DRAM 30 temporarily stores write data received from the host device 2. The DRAM 30 may be built in the memory controller 10.

2. Configuration of Semiconductor Storage Device 2.1 Overall Configuration of Semiconductor Storage Device Subsequently, the semiconductor storage device 20 is described below.

Figure 2:
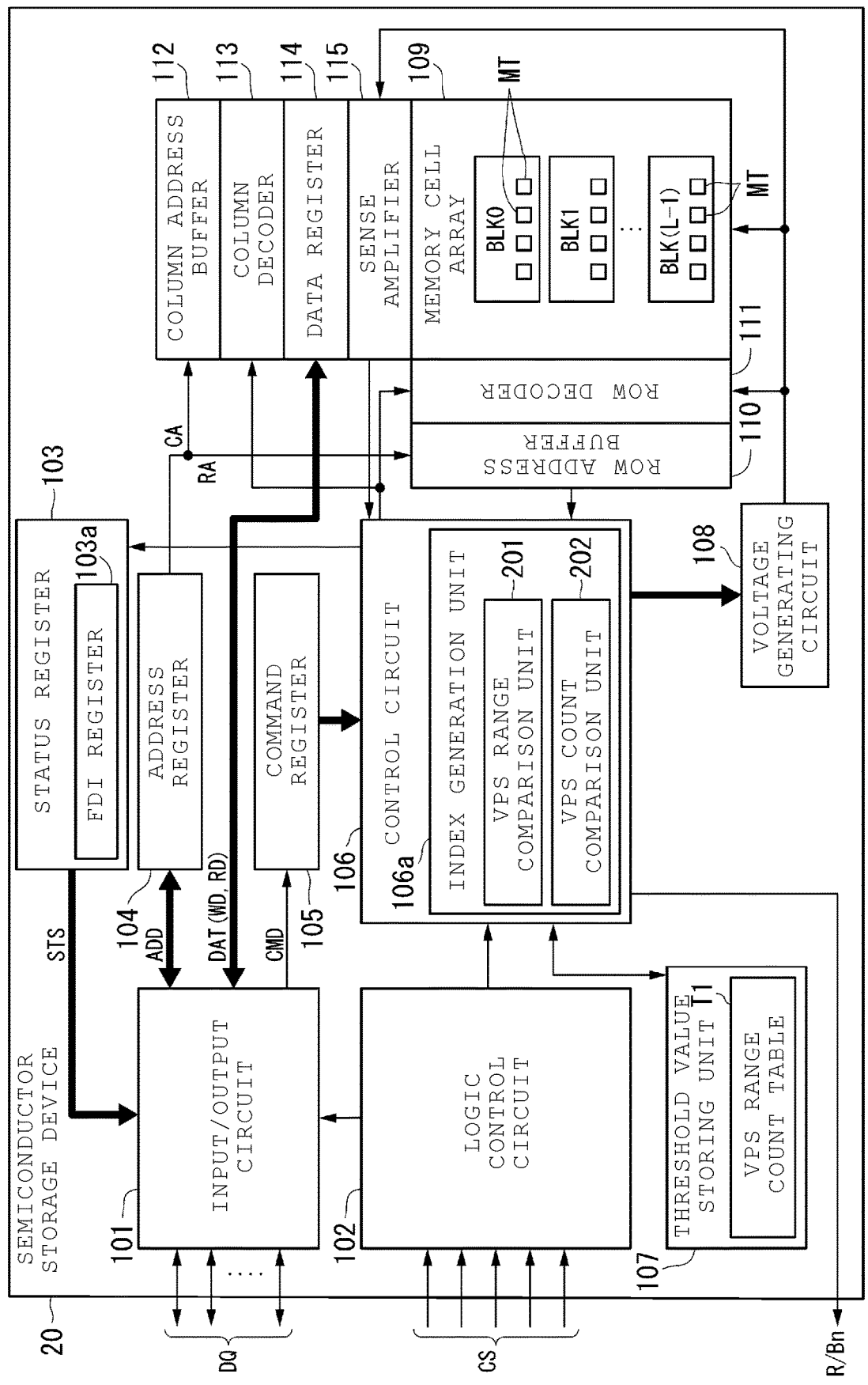
FIG. 2 is a block diagram showing a configuration of a semiconductor storage device according to the first embodiment.

FIG. 2 is a block diagram showing the configuration of the semiconductor storage device 20. The semiconductor storage device 20 includes, for example, an input/output circuit 101, a logic control circuit 102, a status register 103, an address register 104, a command register 105, a control circuit (sequencer) 106, a threshold value storing unit 107, a voltage generating circuit 108, a memory cell array 109, a row address buffer 110, a row decoder 111, a column address buffer 112, a column decoder 113, a data register 114, and a sense amplifier 115.

The input/output circuit 101 controls input and output of a data signal DQ between the memory controller 10 and the semiconductor storage device 20. The input/output circuit 101 includes, for example, an input circuit and an output circuit. The input circuit receives data DAT (for example, write data WD), an address ADD, and a command CMD from the memory controller 10 as the data signal DQ. The input circuit outputs the received data DAT to the data register 114, outputs the received address ADD to the address register 104, and outputs the received command CMD to the command register 105. The output circuit outputs status information STS received from the status register 103 and data DAT (for example, read data RD) received from the data register 114, to the memory controller 10, as the data signal DQ.

The logic control circuit 102 receives various control signals CS from the memory controller 10. The logic control circuit 102 controls the input/output circuit 101 and the control circuit 106 according to the received control signals CS.

The status register 103 stores the status information STS set by the control circuit 106. The status information STS is information indicating the state of the semiconductor storage device 20. The status information STS is information indicating that the write operation, the read operation, or the erasing operation of the data DAT normally ends in the semiconductor storage device 20. If a status acquisition command is received from the memory controller 10, the status information STS stored in the status register 103 is transmitted to the memory controller 10 by the input/output circuit 101.

According to the present embodiment, the status register 103 includes a register 103a that stores an index indicating the reliability of the write operation (hereinafter, referred to as a "write reliability index"). In the following, for the sake of distinction, the register 103a is referred to as a "fine data information (FDI) register 103a". If the status acquisition command corresponding to the write reliability index is received from the memory controller 10, the write reliability index stored in the FDI register 103a is transmitted to the memory controller 10 by the input/output circuit 101. The write reliability index is specifically described below.

The address register 104 temporarily stores the address ADD received from the memory controller 10 via the input/output circuit 101. The address register 104 transmits a row address RA provided in the stored address ADD to the row address buffer 110 and transmits a column address CA provided in the stored address ADD to the column address buffer 112.

The command register 105 temporarily stores the command CMD received from the memory controller 10 via the input/output circuit 101. The command register 105 transmits the stored command CMD to the control circuit 106.

The control circuit 106 controls the entire operations of the semiconductor storage device 20. For example, the control circuit 106 controls the status register 103, the voltage generating circuit 108, the row decoder 111, the column decoder 113, the data register 114, and the sense amplifier 115 according to the command CMD stored in the command register 105. Accordingly, the control circuit 106 performs the write operation, the read operation, or the erasing operation in the semiconductor storage device 20. If the process of the command CMD is completed, the control circuit 106 controls a ready busy signal R/Bn and notifies the memory controller 10 of the process completion. In addition, if the process of the command CMD is completed, the control circuit 106 sets the status information STS indicating the processing result in the status register 103. According to the present embodiment, the control circuit 106 includes an index generation unit 106a that generates a write reliability index. The index generation unit 106a is specifically described below.

The threshold value storing unit 107 stores the threshold value information (for example, a set of threshold values) used for generating the write reliability index. The threshold value storing unit 107 may be provided separately from the memory cell array 109 and may be provided as a part of the memory cell array 109. The threshold value storing unit 107 is specifically described below.

The voltage generating circuit 108 generates a voltage required for the write operation, the read operation, or the erasing operation according to the control of the control circuit 106. The voltage generating circuit 108 supplies the generated voltage to the memory cell array 109, the row decoder 111, and the sense amplifier 115.

The memory cell array 109 includes a plurality of blocks BLK (BLK0, BLK1, . . . , and BLK(L-1) (L is an integer of 1 or more)). Each block BLK includes a plurality of non-volatile memory cells MT associated with rows and columns. Each block BLK stores the data DAT in a non-volatile manner by a voltage applied by the row decoder 111.

The row address buffer 110 temporarily stores the row address RA received from the address register 104. The row decoder 111 selects the memory cells MT provided in the memory cell array 109 based on a decoding result of the row address RA. The row decoder 111 applies a required voltage with respect to the selected memory cell MT.

The column address buffer 112 temporarily stores the column address CA received from the address register 104. The column decoder 113 selects a latch circuit in the data register 114 based on the decoding result of the column address CA.

The data register 114 includes a plurality of latch circuits. Each latch circuit temporarily stores the write data WD or the read data RD. In the write operation, the data register 114 temporarily stores the write data WD received from the input/output circuit 101 and outputs the stored write data WD to the sense amplifier 115. In the read operation, the data register 114 temporarily stores the read data RD received from the sense amplifier 115 and outputs the stored read data RD to the input/output circuit 101.

In the write operation, the sense amplifier 115 stores the write data WD received from the data register 114 in the memory cell array 109. In the read operation, the sense amplifier 115 senses states of the plurality of memory cells MT provided in the memory cell array 109 and generates the read data RD based on the sensed state. The sense amplifier 115 stores the generated read data RD in the data register 114.

2.2 Configuration of Memory Cell Array

Subsequently, the configuration of the memory cell array 109 is described.

Figure 3:
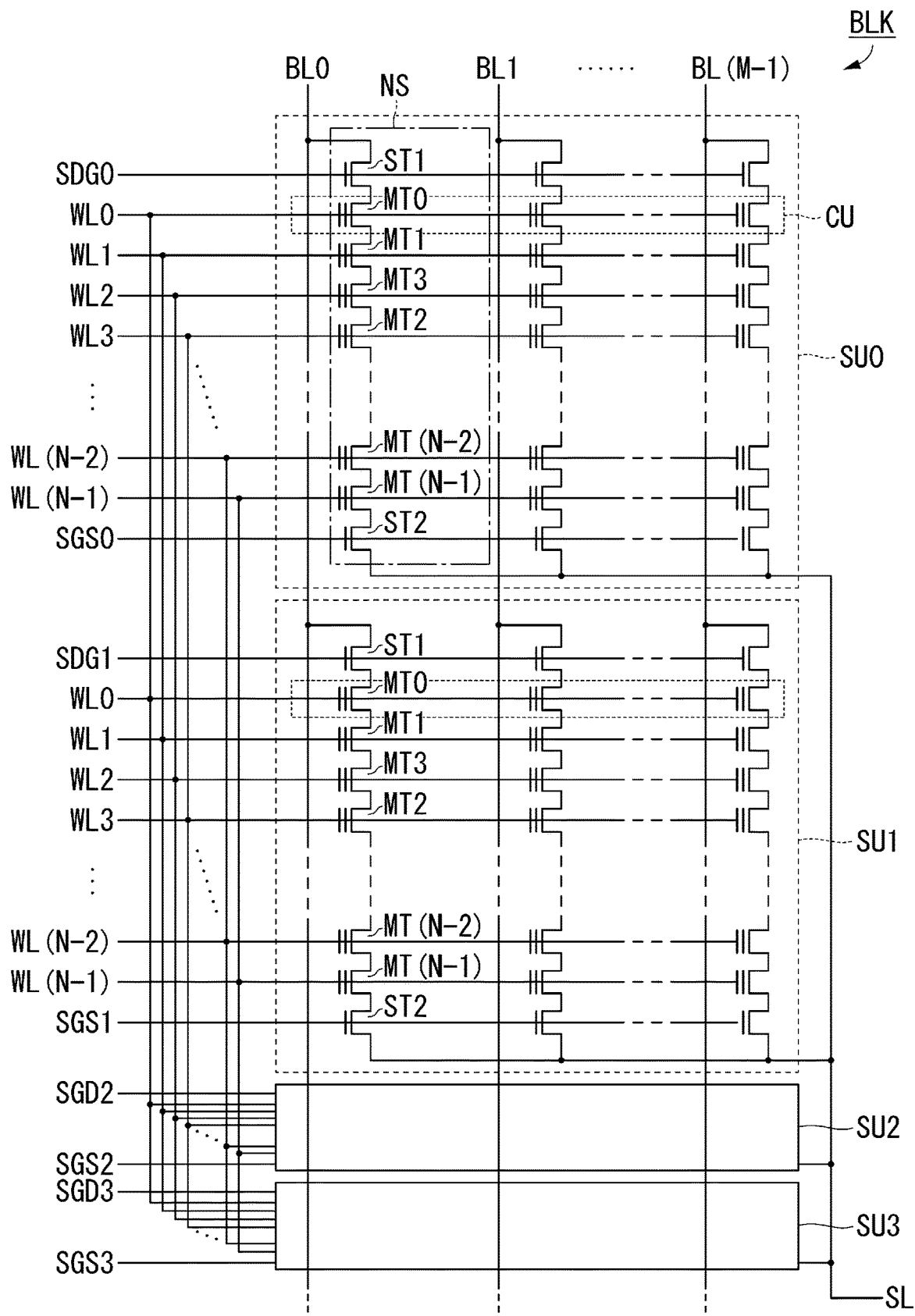
FIG. 3 is a diagram showing a circuit configuration provided in a memory cell array according to the first embodiment.

FIG. 3 is a diagram showing the circuit configuration provided in the memory cell array 109 and extracts one block BLK among the plurality of blocks BLK provided in the memory cell array 109. The block BLK includes, for example, four string units SU0 to SU3.

Each string unit SU includes a plurality of NAND strings NS associated with bit lines BL0 to BL(M-1) (M is an integer of 1 or more). In the following, if the bit lines BL0 to BL(M-1) are not distinguished from each other, the bit lines BL0 to BL(M-1) are simply referred to as "bit lines BL". Each NAND string NS includes, for example, the memory cells MT0 to MT(N-1) (N is an integer of 1 or more), a first select transistor ST1, and a second select transistor ST2. Each memory cell MT is a memory cell transistor that includes a control gate and a charge storage layer, and stores data in a non-volatile manner. The first select transistor ST1 and the second select transistor ST2 are used for selecting the NAND strings NS during various operations.

In each NAND string NS, the memory cells MT0 to MT(N-1) are connected to each other in series. The drain of the first select transistor ST1 is connected to the bit line BL corresponding to the corresponding NAND string NS. The source of the select transistor ST1 is connected to one end of the memory cells MT0 to MT(N-1) connected in series. The drain of the second select transistor ST2 is connected to the other end of the memory cells MT0 to MT(N-1) connected in series. The source of the select transistor ST2 is connected to a source line SL.

In the same block BLK, the control gates of the memory cells MT0 to MT(N-1) are commonly connected to word lines WL0 to WL(N-1), respectively. The gates of the first select transistors ST1 in the string units SU0 to SU3 are commonly connected to select gate lines SGD0 to SGD3, respectively. The gates of the second select transistors ST2 in the string units SU0 to SU3 are commonly connected to the select gate lines SGS0 to SGS3, respectively.

The set of the plurality of memory cells MT connected to the common word line WL in one string unit SU is referred to as a cell unit CU. For example, the storage capacity of the cell unit CU including the plurality of memory cells MT each of which stores 1 bit data is defined as "1 page data". The cell unit CU may include the storage capacity of 2 page data or more, according to the number of bits of data stored in the memory cell MT.

Figure 4:
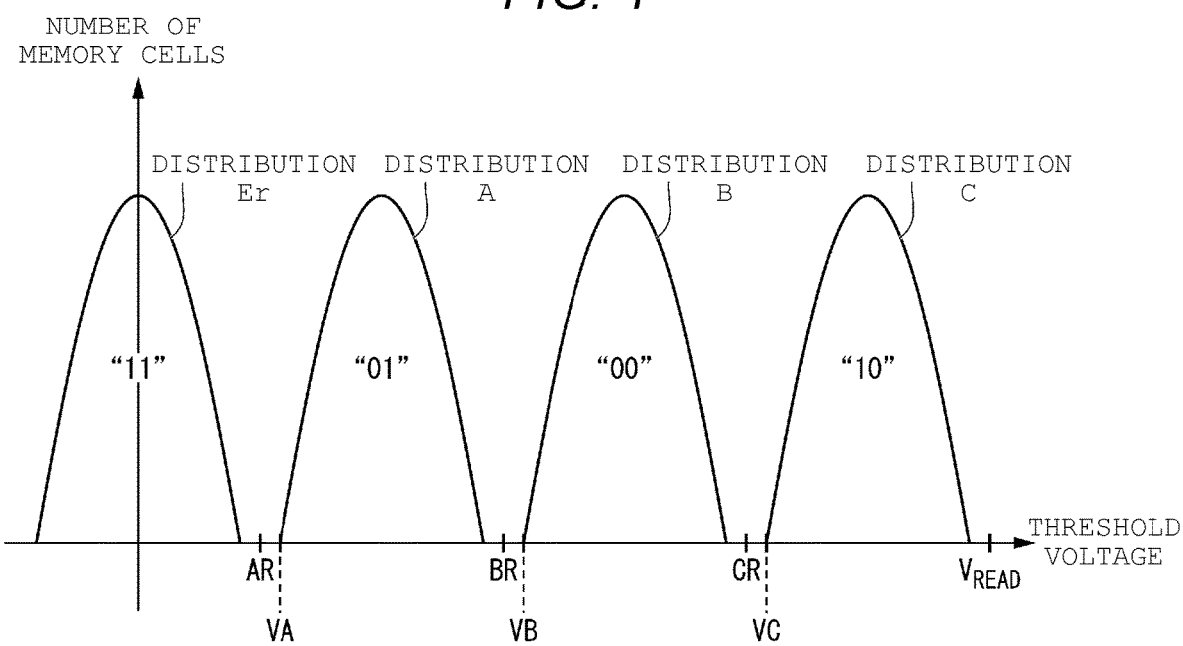
FIG. 4 is a diagram showing a distribution of a threshold voltage of a memory cell according to the first embodiment.

3. Basic Operation of Semiconductor Storage Device 3.1 Distribution of Threshold Voltage of Memory Cell FIG. 4 is a diagram showing the distribution of the threshold voltage of the memory cell MT. In FIG. 4, the horizontal axis indicates a threshold voltage of the memory cell MT, and the vertical axis indicates the number of memory cells MT indicating certain bit values (data values). Here, for better understanding of the description, a case where each memory cell MT is a multi-level cell (MLC) that can store the 2-bit data value is described as an example. However, the content of the present embodiment can be applied to a case where the memory cell MT is a triple level cell (TLC) that can store a 3-bit data value or a quad level cell (QLC) that can store a 4-bit data value.

If each memory cell MT is a multi-level cell (MLC), the distribution of the threshold voltage of the memory cell MT includes four lobs as shown in FIG. 4. The threshold voltage of each memory cell MT is controlled so that the threshold voltage belongs to any one of the four lobs which are a distribution Er, a distribution A, a distribution B, and a distribution C. Each memory cell MT can store quaternary data "xy" defined by data "x" that belongs to an upper page and data "y" that belongs to a lower page. Values of the data "x" and the data "y" are a code "0" or a code "1". The correspondence between the four distributions and the data value of the quaternary data "xy" is set in advance. In the following, if the distribution Er, the distribution A, the distribution B, and the distribution C are not distinguished from each other, the distributions are referred to as "threshold voltage distributions". In addition, in the following, the state of the threshold voltage corresponding to the distribution A is referred to as "A state", the state of the threshold voltage corresponding to the distribution B is referred to as "B state", and the state of the threshold voltage corresponding to the distribution C is referred to as "C state".

In addition, the write data is randomized and written so that the numbers of the memory cells MT that belong to the distribution Er, the distribution A, the distribution B, and the distribution C are almost equal. The randomization means generating randomized data by adding a random value to an original data string and writing the randomized data to the semiconductor storage device 20. Various well-known methods may be employed as the randomizing process.

3.2 Data Write Operation

Subsequently, the data write operation (program operation) is described.

Figure 5:
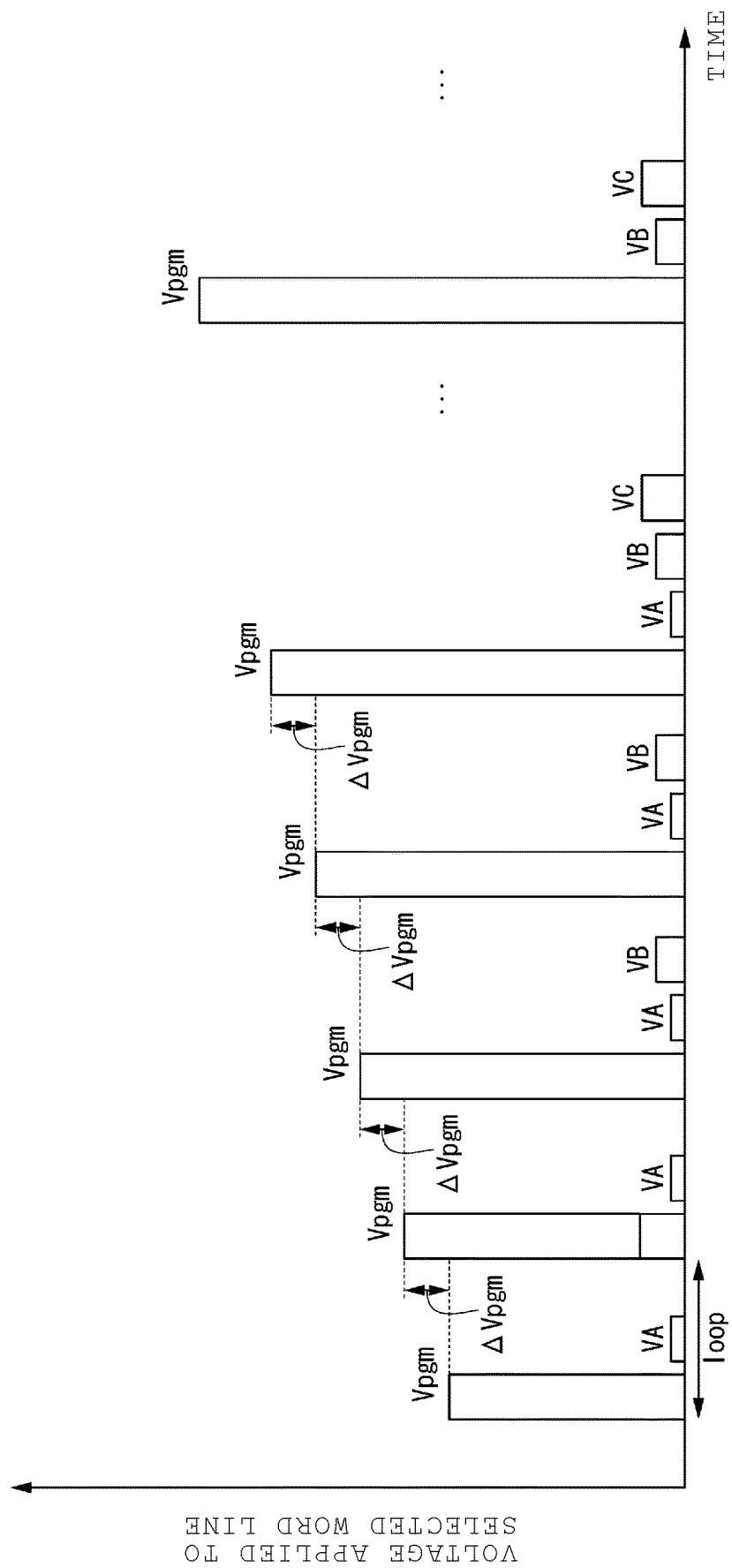
FIG. 5 is a diagram showing a data write operation according to the first embodiment.

FIG. 5 is a diagram showing the data write operation. The data write operation is performed by repeating the software program loop including the operation of applying a write voltage Vpgm, the program verification, the voltage change operation of increasing the set value of the write voltage Vpgm until the predetermined condition is satisfied.

The operation of applying the write voltage Vpgm is an operation of applying the write voltage Vpgm to the word lines WL (hereinafter, referred to as "the selected word lines WL") connected to one or more of the memory cells MT (hereinafter, referred to as the "selected memory cells MT") as writing targets and increasing the threshold voltage of the selected memory cell MT to the threshold voltage corresponding to the desired data value. The operation of applying the write voltage Vpgm is performed, for example, in the state in which the voltage of the bit line BL connected to the selected memory cell MT becomes 0 volts by the sense amplifier 115.

The program verification is an operation of verifying whether the threshold voltage of the selected memory cell MT reaches the threshold voltage corresponding to the desired data value, that is, the desired data value is written to the selected memory cell MT. In the program verification, in order to determine the completion of a writing, program verification voltage VA, VB, or VC is used. The program verification voltages VA, VB, and VC have different voltage values (see FIG. 4).

The program verification voltage VA is a verification voltage corresponding to A state. If the selected memory cell MT written to A state has the threshold voltage equal to or larger than the program verification voltage VA, it is determined that the writing to the corresponding selected memory cell MT is completed. The program verification voltage VB is the verification voltage corresponding to B state. The program verification voltage VB has the larger voltage value than the program verification voltage VA. If the selected memory cell MT written to B state has the threshold voltage equal to or larger than the program verification voltage VB, it is determined that the writing to the corresponding selected memory cell MT is completed. The program verification voltage VC is a verification voltage corresponding to C state. The program verification voltage VC has the larger voltage value than the program verification voltage VB. If the selected memory cell MT written in C state has the threshold voltage equal to or larger than the program verification voltage VC, it is determined that the writing to the corresponding selected memory cell MT is completed. The program verification voltage VA is an example of the "first verification voltage". The program verification voltage VB is an example of the "second verification voltage".

In the program verification, a voltage Vread is applied to the word lines WL other than the selected word line WL (hereinafter, referred to as "the non-selected word lines WL") and the program verification voltage VA, VB, or VC is applied to the selected word line WL. The voltage Vread is the voltage set to be higher than the threshold voltage of the any one of the memory cells MT. Also, if the predetermined cell current does not flow, it is determined that the writing to the selected memory cell MT is completed.

If the voltage change operation is an operation of increasing the set value of the write voltage Vpgm by a predetermined amount, if it is determined in the program verification that the threshold voltage of the selected memory cell MT does not reach the threshold voltage corresponding to the desired data value (the program verification is not passed). For example, the row decoder 111 increases (steps up) the write voltage Vpgm applied to the selected word line WL by ΔVpgm, whenever the software program loop is repeated one time, as the voltage change operation. Accordingly, the threshold voltage of the selected memory cell MT connected to the selected word line WL increases by almost ΔVpgm, whenever the software program loop is performed.

If the threshold voltage of the selected memory cell MT gradually increases, in the program verification, the threshold voltage of the selected memory cell MT slowly goes closer to the threshold voltage corresponding to the desired data value and eventually reaches the threshold voltage corresponding to the desired data value. If the threshold voltage of the selected memory cell MT reaches the threshold voltage corresponding to the desired data value, the program verification is passed. If the program verification is passed, the writing to the selected memory cell MT ends, and the bit line BL corresponding to the selected memory cell MT enters the non-selected state (write protected). For example, the bit line BL enters the non-selected state by increasing and fixing the voltage applied to the corresponding bit line BL.

As shown in FIG. 5, the program verification described above includes the program verification on one or more of A state, B state, and C state according to the loop number of the software program loop. That is, with respect to the operation of applying one write voltage Vpgm, the plurality of the program verifications with different program verification voltages can be performed. For example, if the loop number of the software program loop is small, there is no memory cell MT of which the threshold voltage increases to C state, and thus the program verifications in A state and B state are performed. On the other hand, if the loop number of the software program loop is large, all of the memory cells MT written in A state pass the program verification, and thus the program verification in A state is not performed.

The data write operation described above is performed by the control circuit 106, the row decoder 111, and the sense amplifier 115. The data write operation is performed, for example, in the order of the word lines WL0, WL1, WL2, ..., and WL(N-1).

In the write operation on each word line WL, if the program verifications on all of the selected memory cells MT connected to the corresponding word line WL are passed, the control circuit 106 determines that the write operation is successful. If it is determined that the write operation is successful, the control circuit 106 sets the status information STS corresponding to the write operation success to the status register 103.

On the other hand, if the program verification is not passed even if the loop number reaches the maximum value of software program loop set in advance, the control circuit 106 determines that the write operation fails. If it is determined that the write operation fails, the control circuit 106 stores the status information STS corresponding to the write operation failure (Program Status Fail: PSF) in the status register 103.

3.3 Data Read Operation

In the data read operation, the sense amplifier 115 precharges a power supply voltage Vcc to the bit line BL. The row decoder 111 applies the transmission voltage to the non-selected word line WL and causes the memory cell MT that belongs to the non-selected word line WL to enter a conductive state. Also, the row decoder 111 applies the read voltage to the word line WL (the selected word line WL) connected to one or more memory cells MT as reading targets. As the read voltage, a plurality of types of read voltages AR, BR, or CR corresponding to the threshold voltage distribution (the distribution Er, the distribution A, the distribution B, or the distribution C) for each data value are sequentially applied (see FIG. 4). Also, the sense amplifier 115 determines the data value stored in the memory cell MT as reading targets by detecting which of the read voltages AR, BR, or CR is applied when the outflow of charges stored by the precharge to the source line SL occurs.

For example, if the read voltage AR is set between the distribution Er and the distribution A, it is determined that the memory cell MT having the threshold voltage less than the read voltage AR is in the distribution Er. If the read voltage BR is set between the distribution A and the distribution B, it is determined that the memory cell MT having the threshold voltage less than the read voltage BR is in the distribution A. In the same manner, if the read voltage is set between two adjacent distributions, it is determined that the memory cell MT having the threshold voltage less than the read voltage is in the distribution with a lower threshold voltage among two distributions.

4. Read Verification

According to the present embodiment, if the program verification is passed, and the write operation is completed, the control circuit 106 can perform the operation of verifying whether the write data written in the write operation can be normally read. In the present application, the corresponding verification operation is referred to as "read verification".

FIG. 6 is a diagram showing the read verification. As shown in FIG. 6, also when the write operation failure (PSF) does not occur, and it is determined that the write operation is successful, if the data read operation is actually tried, in some case, the data cannot be normally read. For example, the area indicated by a broken line F in FIG. 6 shows a case where the number of memory cells MT that fails the determination of the data value (the number of error bits) exceeds the allowable amount, and there is failure in the reading of data in the data read operation, even when it is determined that the write operation is successful in the semiconductor storage device 20. The number of error bits that exceeds the allowable amount means, for example, that the number of error bits exceeds the error correction capability of the ECC circuit 15.

FIG. 7 is a diagram showing deviations of the threshold voltage distributions of the memory cells MT. Broken lines in FIG. 7 show a plurality of threshold voltage distributions in an ideal state (normal state) of the semiconductor storage device 20. Meanwhile, solid lines in FIG. 7 show a plurality of threshold voltage distributions in the deteriorated state (abnormal state) of the semiconductor storage device 20. As indicated by solid lines in FIG. 7, for example, if the characteristics of the memory cell MT vary, the threshold voltage distributions are widened, and the tails of the plurality of threshold voltage distributions partially overlap. The area where a plurality of threshold voltage distributions overlap is an area where an error is highly likely to occur in the data read operation even if it is determined that the write operation is successful.

The read verification is the verification operation that is performed in advance in order to prevent the data reading failure as above. In the read verification, according to the completion of the write operation, the read operation is performed on the plurality of (for example, all) memory cells MT connected to the word lines WL as the writing targets, and whether the data written to the word lines WL as the writing targets can be normally read is verified.

For example, in the read verification, the read command is transmitted from the memory controller 10 to the semiconductor storage device 20, and the data is read from the plurality of (for example, all) memory cells MT connected to the word lines WL as the writing target, to the memory controller 10. Also, in the memory controller 10, if the number of error bits provided in the read data is counted, and the counted number of error bits is equal to or less than the predetermined value, the data can be normally read, and the read verification is passed. The read verification may be performed according to the completion of the write operation to one word line WL and may be performed according to the completion of the write operation to the plurality of word lines WL.

Here, in the general read operation (read operation of reading the data according to the request from the host device 2), the memory controller 10 transmits the read command according to the read request from the host device 2 to the semiconductor storage device 20. With respect to the read command, the semiconductor storage device 20 performs the read operation of reading the data from the plurality of memory cells MT and transmitting the read data to the memory controller 10.

According to the present embodiment, the operation content of the read verification is the same as the operation content of the read operation performed according to the read request from the host device 2. That is, similarly to the read operation performed according to the read request from the host device 2, the operation content of the read verification includes sequentially applying the plurality of types of the read voltages AR, BR, or CR to the word lines WL as the data reading target and reading the data values corresponding to the distribution Er, the distribution A, the distribution B, or the distribution C from the plurality of memory cells MT connected to the word lines WL as the reading targets.

5. Efficiency Relating to Write Operation

5.1 Write Reliability Index

If the read verification described above is performed whenever the data write operation is performed, it may be difficult to improve the process speed of the memory system 1. Here, if the memory controller 10 according to the present embodiment performs the data write operation, the reliability of the corresponding write operation is evaluated based on the predetermined index. Also, the memory controller 10 skips the read verification if it is determined that the reliability of the write operation is high, and performs the read verification if it is determined that the reliability of the write operation is low. Hereinafter, the content is specifically described.

As shown in FIG. 2, the control circuit 106 includes the index generation unit 106a. For example, the index generation unit 106a generates an index indicating the reliability of the corresponding write operation (write reliability index) based on the information obtained according to the progress of writing the data value in the program operation. According to the present embodiment, the index generation unit 106a generates the write reliability index based on first information obtained according to the progress of writing the data value corresponding to A state in the program operation (first data value), second information obtained according to the progress of writing the data value corresponding to B state in the program operation (second data value), and third information obtained according to the progress of writing the data value corresponding to C state in the program operation (third data value).

The first information includes, for example, at least one of information indicating the number of software program loops performed until the first predetermined condition is satisfied, and information indicating the number of memory cells MT to which the writing is completed before the first predetermined condition is satisfied. Here, the first predetermined condition indicates, for example, all of the selected memory cells MT to which the first data values are written, among the plurality of memory cells MT connected to one selected word line WL, pass the program verification. "The number of memory cells MT in which the writing is completed before the first predetermined condition is satisfied" can include the number of memory cells MT in which the writing of the second data values or the third data value is completed while the software program loop accompanied by the program verification voltage VA is repeated. This definition is applied to the second predetermined condition or the third predetermined condition described below, in the same manner.

The second information includes, for example, at least one of the information indicating the number of software program loops performed until the second predetermined condition is satisfied, and the information indicating the number of memory cells MT in which the writing is completed before the second predetermined condition is satisfied. Here, the second predetermined condition indicates that all of the selected memory cells MT to which the second data values are written, among the plurality of memory cells MT connected to one selected word line WL, pass the program verification.

In the same manner, the third information includes, for example, at least one of the information indicating the number of software program loops performed until the third predetermined condition is satisfied, and the information indicating the number of memory cells MT in which the writing is completed before the third predetermined condition is satisfied. Here, the third predetermined condition indicates that all of the selected memory cells MT to which the third data values are written, among the plurality of memory cells MT connected to one selected word line WL, pass the program verification.

At one point of view, the first information and the second information are information that is obtained during the corresponding program operation relating to the program operation to one of the selected word lines WL. For example, the first information is information that is obtained when the write operation corresponding to A state is completed. The second information is information that is obtained when the write operation corresponding to B state is completed.

At another point of view, the first information, the second information, and the third information are information indicating deviations of the data values from the design ideal values relating to the progress of the write operation. For example, the first information is information indicating a deviation from the design ideal value relating to the progress of the write operation corresponding to A state. The second information is information indicating a deviation from the design ideal value relating to the progress of the write operation corresponding to B state. The third information is information indicating a deviation from the design ideal value relating to the progress of the write operation corresponding to C state.

The index generation unit 106a according to the present embodiment includes a range comparison unit 201 and a count comparison unit 202 (see FIG. 2). In the following, for convenience of description, the range comparison unit 201 is referred to as the "Verify Pass Stage (VPS) range comparison unit 201". In addition, the count comparison unit 202 is referred to as the "VPS count comparison unit 202". The threshold value storing unit 107 stores a VPS range count table T1.

FIG. 8 is a diagram illustrating an example of the VPS range count table T1. "VPS range" in FIG. 8 is threshold values indicating the range of the design ideal values of the number of software program loops performed until the write operation of each level is completed in the write operation corresponding to each level of A state, B state, or C state. "Min" of the "VPS range" indicates the lower limit of the design ideal value of the number of software program loops. "Max" of the "VPS range" indicates an upper limit of the design ideal value of the number of software program loops.

For example, if the number of software program loops performed until the write operation corresponding to A state is completed is three or four, it is determined that the corresponding write operation has reliability. In the same manner, if the number of software program loops performed until the write operation corresponding to B state is completed is five or six, it is determined that the corresponding write operation has reliability. If the number of software program loops performed until the write operation corresponding to C state is completed is seven or eight, it is determined that the corresponding write operation has reliability. On the other hand, if the number of software program loops performed until the write operation of each level is completed is deviated from the range of the design ideal values provided in the VPS range count table T1, it is determined that corresponding write operation does not have reliability (is concerned). According to the present embodiment, the determination relating to the number of software program loops is performed by comparing the number of software program loops actually detected in the write operation with the threshold value of the number of software program loops provided in the VPS range count table T1 by the VPS range comparison unit 201.

The "VPS count" in FIG. 8 is a threshold value indicating the upper limit of the design ideal value of the number of memory cells MT in which the writing is completed before the write operation of each level is completed during the write operation corresponding to each level of A state, B state, and C state.

For example, if the number of memory cells MT in which the writing of the desired data value (data value that is any one of A state, B state, or C state) is completed before the write operation corresponding to A state is completed is 6,000 or less, it is determined that the corresponding write operation has reliability. In the same manner, if the number of memory cells MT in which the writing of the desired data value (data value that is any one of A state, B state, or C state) is completed before the write operation corresponding to B state is completed is 12,000 or less, it is determined that the corresponding write operation has the reliability. If the number of memory cells MT in which the writing of the desired data value (data value that is any one of A state, B state, or C state) is completed before the write operation corresponding to C state is completed is 18,000 or less, it is determined that the corresponding write operation has the reliability. On the other hand, if the number of memory cells MT in which the writing is completed before the write operation of each level is completed exceeds the upper limit provided in the VPS range count table T1, it is determined that the corresponding write operation does not have reliability (is concerned). According to the present embodiment, the determination relating to the number of memory cells MT is performed by comparing the number of memory cells MT in which the writing of the desired data value is completed, which are actually detected in the write operation, with the threshold value of the number of memory cells MT provided in the VPS range count table T1 by the VPS count comparison unit 202.

The set value of the VPS range count table T1 may be confirmed when the semiconductor storage device 20 is manufactured, and the indicated value from the host device 2 can be set based on the request from the host device 2.

According to the present embodiment, as the value of the write reliability index, "1" is set if it is determined the write operation has reliability by the index generation unit 106a, and "0" is set if it is determined that the write operation is concerned by the index generation unit 106a. According to the present embodiment, the index generation unit 106a sets "1" as the value of the write reliability index if it is determined that the write operation has reliability in both of the determination by the VPS range comparison unit 201 and the determination by the VPS count comparison unit 202, and stores the value of the set write reliability index in the FDI register 103a. However, the index generation unit 106a sets "0" as the value of the write reliability index if it is determined the write operation is concerned in at least one determination of the determination by the VPS range comparison unit 201 and the determination by the VPS count comparison unit 202, and stores the value of the set write reliability index in the FDI register 103a.

As described above, the value of the write reliability index stored in the FDI register 103a can be read by a dedicated command from the memory controller 10. If the dedicated command is issued from the memory controller 10, the value of the write reliability index is transmitted from the FDI register 103a to the input/output circuit 101 and is transmitted to the memory controller 10. The value of the write reliability index stored in the FDI register 103a is updated whenever a new write reliability index is set in the control circuit 106.

5.2 Flow of Process

Subsequently, the flow of the process relating to the data write operation is described.

Figure 9:
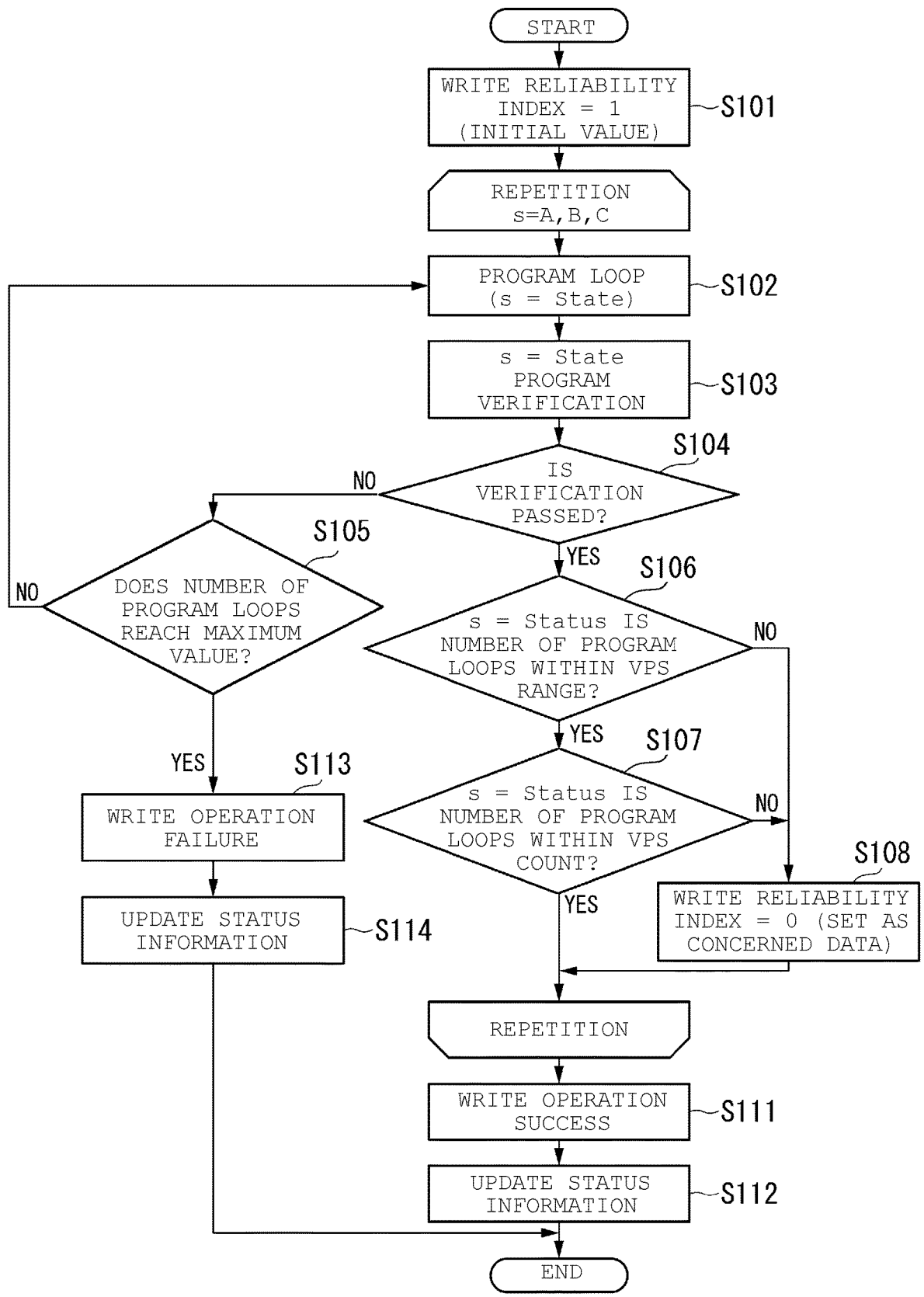
FIG. 9 is a flowchart showing a flow of a process of the semiconductor storage device according to the first embodiment.

FIG. 9 is a flowchart showing the flow of the process of the semiconductor storage device 20. A series of the processes shown in FIG. 9 is a process performed according to the transmission of write command (program command) from the memory controller 10 to the semiconductor storage device 20 and indicates a process relating to one selected word line WL performed with respect to the write command. In the following, the control main body is described as the control circuit 106, but the control is performed by the control circuit 106 appropriately in association with the other configurations (such as the row decoder 111 or the sense amplifier 115). In addition, "State" in FIG. 9 means the threshold voltage distribution of the memory cell MT described above.

First, if the write command transmitted from the memory controller 10 is received by the semiconductor storage device 20, the control circuit 106 initializes the write reliability index stored in the FDI register 103a (S101). For example, the control circuit 106 initializes the value of the write reliability index stored in the FDI register 103a to corresponding to the presence of reliability of the write operation. Subsequently, the control circuit 106 repeats the processes from S102 to S108 described below in the write operations corresponding to each of A state, B state, and C state.

For example, first, the control circuit 106 applies the write voltage Vpgm to the selected word line WL as the write operation corresponding to A state (S102) and performs the program verification corresponding to A state (S103). Also, the control circuit 106 determines whether the program verification corresponding to A state is passed (S104).

If the program verification is not passed (S104: NO), the control circuit 106 determines whether the number of performed software program loops reaches the maximum value (S105). If it is determined that the number of software program loops does not reach the maximum value (S105: NO), the control circuit 106 performs the voltage change operation of increasing the set value of the write voltage Vpgm by the predetermined amount (ΔVpgm) together with increasing the count of the number of software program loops by one, and returns to the process of S102. Accordingly, the control circuit 106 increases the write voltage Vpgm applied to the selected word line WL by ΔVpgm whenever the software program loop is repeated once.

If the program verification corresponding to A state is passed (S104: YES) while the software program loop is repeated, the index generation unit 106a determines whether the count of the number of software program loops performed until the write operation of A state is completed is within the first predetermined range (for example, three to four times) provided in the VPS range count table T1 (S106).

If the count of the number of performed software program loops is within the first predetermined range (S106: YES), the index generation unit 106a subsequently determines whether the number of memory cells MT in which the writing of the data value is completed before the write operation of A state is completed is equal to or lower than the first predetermined amount (for example, 6,000 or lower) provided in the VPS range count table T1 (S107).

If the count of the number of software program loops performed until the write operation of A state is completed is not within the first predetermined range (S106: NO), or the number of memory cells MT in which the writing of the data value is completed before the write operation of A state is completed is not equal to or less than the first predetermined amount (S107: NO), the index generation unit 106a sets "0" corresponding to the absence of the reliability of the write operation (concerned), as the value of the write reliability index and stores the value of the set write reliability index in the FDI register 103a (S108).

On the other hand, if the count of the number of performed software program loops is in the first predetermined range (S106: YES), and the number of memory cells MT in which the writing of the data value is completed is equal to or less than the first predetermined amount (S107: YES), the index generation unit 106a maintains the value of the write reliability index as the initial value. Also, with respect to the write operation corresponding to B state, the control circuit 106 repeats the processes from S102 to S108 described above. With respect to details of the processes of this case, in the description relating to the writing of A state, "A state" may be read as "B state", "in the first predetermined range (for example, three to four times)" may be read as "in the second predetermined range (for example, five to six times)", and "equal to or less than the first predetermined amount (6,000 or less)" may be read as "equal to or less than the second predetermined amount (12,000 or less)".

Also, if the count of the number of software program loops performed until the write operation of B state is completed is in the second predetermined range (S106: YES), and the number of memory cells MT in which the writing of the data value is completed before the write operation of B state is completed is equal to or less than the second predetermined amount (S107: YES), the index generation unit 106a maintains the value of the write reliability index as the initial value. Also, in the write operation corresponding to C state, the control circuit 106 repeats the processes from S102 to S108 described above. With respect to details of the processes of this case, in the description relating to the writing of A state, "A state" may be read as "C state", "in the first predetermined range (for example, three to four times)" may be read as "in the third predetermined range (for example, seven to eight times)", and "equal to or less than the first predetermined amount (6,000 or less)" may be read as "equal to or less than the third predetermined amount (18,000 or less)".

Also, if the write operation corresponding to C state is completed while the software program loop is repeated, the control circuit 106 determines that write operation is successful (S111). If it is determined that the write operation is successful, the control circuit 106 stores the status information STS corresponding to the write operation success in the status register 103 (S112), and outputs the ready busy signal R/Bn indicating that the write operation corresponding to the write command ends.

On the other hand, if it is determined that the count of the number of software program loops reaches the maximum value while the software program loop is repeated (S105: YES), the control circuit 106 determines that the write operation fails (S113). If it is determined that the write operation fails, the control circuit 106 stores the status information STS corresponding to the write operation failure (Program Status Fail: PSF) in the status register 103 (S114) and outputs the ready busy signal R/Bn indicating that the write operation corresponding to the write command ends.

Figure 10:
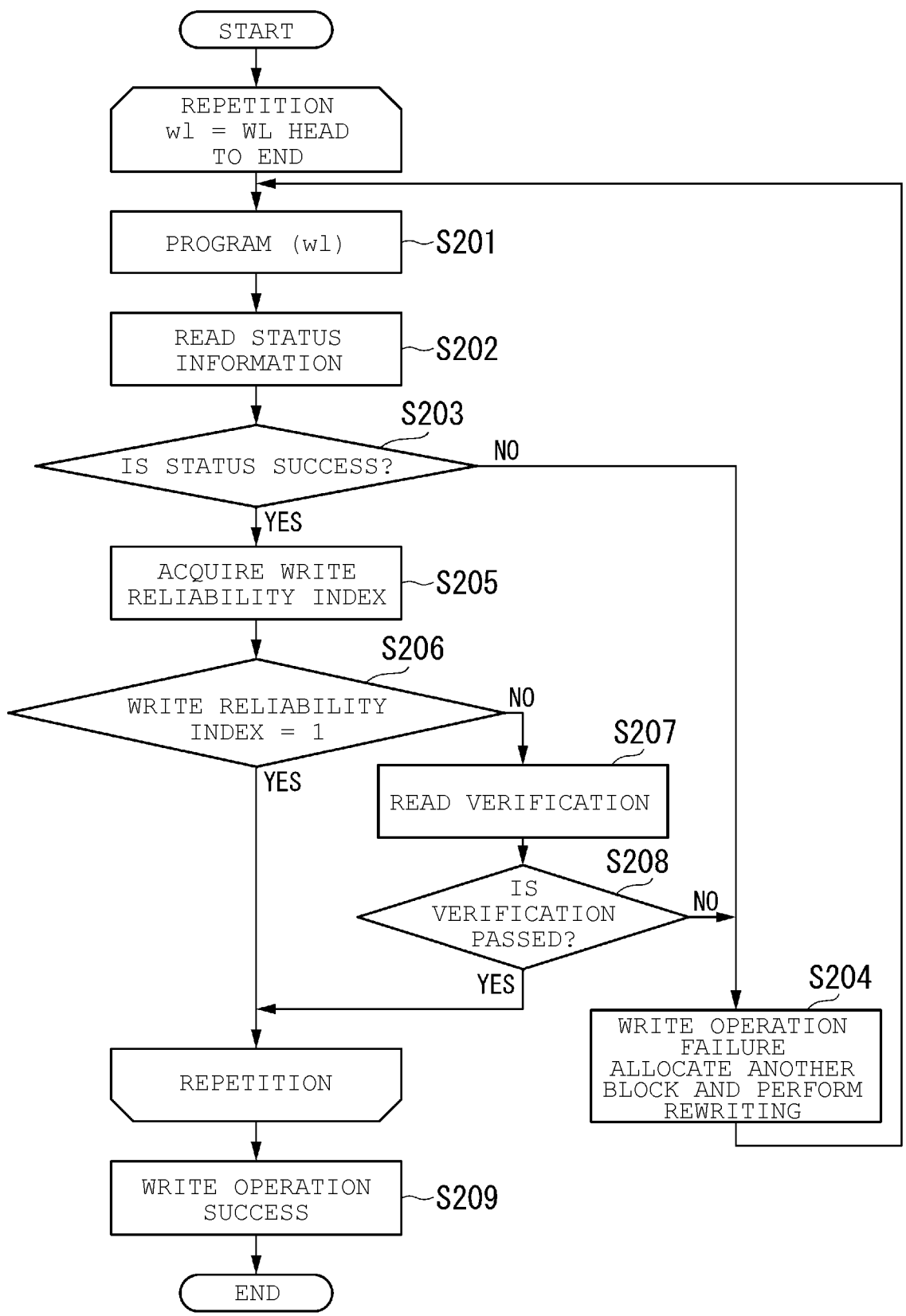
FIG. 10 is a flowchart showing a flow of an example of a process of a memory controller according to the first embodiment.

FIG. 10 is a flowchart showing the flow of an example of the process of the memory controller 10. The flow of the process described below is an example of sequence of writing to one block BLK in the semiconductor storage device 20. The process described below is an example of determining whether the read verification is performed on one word line WL for each write operation.

The memory controller 10 sequentially performs the processes from S201 to S208 described below for each of the plurality of word lines WL.

First, the memory controller 10 generates the write command with respect to one selected word line WL as a writing target and transmits the generated write command to the semiconductor storage device 20 (S201). Accordingly, the processes from S101 to S114 shown in FIG. 9 in the semiconductor storage device 20 are performed.

First, if the ready busy signal R/Bn output from the semiconductor storage device 20 indicates the end of the write operation, the memory controller 10 acquires the status information STS indicating the success or failure of the write operation from the semiconductor storage device 20 (S202). For example, the memory controller 10 transmits the status acquisition command for reading the status information STS stored in the status register 103 to the semiconductor storage device 20 to acquire the status information STS.

Subsequently, the memory controller 10 determines whether the acquired status information STS indicates the write operation success (S203). If the status information STS indicates the write operation failure (S203: NO), the memory controller 10 allocates another block BLK and performs the write operation again (S204). In this case, the process returns to S201 and the subsequent processes are performed again.

If the status information STS indicates the write operation success (S203: YES), the memory controller 10 acquires the write reliability index from the semiconductor storage device 20 (S205). For example, the memory controller 10 transmits the status acquisition command for reading the write reliability index stored in the FDI register 103a to the semiconductor storage device 20 to acquire the write reliability index.

Subsequently, the memory controller 10 determines whether the value of the write reliability index is "1" corresponding to the presence of the reliability of the write operation (S206). According to the present embodiment, if the value of the write reliability index is "1" (S206: YES), the memory controller 10 skips the read verification since the reliability of the program operation is sufficiently high. In this case, the memory controller 10 ends the process relating to the word line WL subjected to the read verification and performs the processes from S201 to the next word line WL as a writing target.

On the other hand, if the value of the write reliability index is not "1" (S206: NO), the memory controller 10 performs the read verification without skipping the read verification (S207). That is, the memory controller 10 determines whether the data can be normally read from the plurality of memory cells MT connected to the selected word line WL (S208). For example, the memory controller 10 determines whether the number of error bits provided in the read data that is read is equal to or less than the predetermined value.

If the data can be normally read according to the read verification (S208: YES), the memory controller 10 ends the process relating to the word line WL in which the read verification is performed and performs the processes from S201 on the next word line WL as a writing target.

On the other hand, if the data cannot be normally read according to the read verification (S208: NO), the memory controller 10 determines that the write operation fails, allocates another block BLK, and performs the write operation again (S204). In this case, the process returns to S201 and the subsequent processes are performed again.

If the processes of S201 to S208 described above are performed on all of the word lines WL as the writing targets, the memory controller 10 determines that the write operation is successful (S209) and completes the series of the processes.

6. Advantages

In the semiconductor storage device 20, if the writing of all of the data value is completed before the number of software program loops reaches the maximum value, it is regarded that the write operation is successful. However, the success or failure of the write operation in the semiconductor storage device 20 merely indicates that the write operation normally ends, and does not determine whether the write data can be correctly read when being read. Therefore, it is preferable to perform the read verification by the memory controller 10 and verify whether the write data can be normally read. However, if the read verification is performed on all of the write operations, the processing time for each write operation becomes long, and thus the throughput of the data writing may decrease.

Also, according to the present embodiment, the memory system 1 includes the memory controller 10 and the semiconductor storage device 20. The semiconductor storage device 20 includes the word lines WL connected to the plurality of memory cells MT. If data is written to the plurality of memory cells MT, the memory controller 10 transmits the write command to the semiconductor storage device 20. With respect to the write command, the semiconductor storage device 20 performs the program operation of performing the software program loop including applying the write voltage to the word lines WL, applying the first verification voltage to the word line WL to perform the program verification of performing write determination of the first data value provided in the data, and increasing the set value of the write voltage if it is determined that the writing of the first data value is not completed, until the first predetermined condition is satisfied, and generates the write reliability index based on the first information obtained according to the progress of the writing of the first data value in the program operation, and the memory controller 10 determines whether to perform the read verification of reading the data from the plurality of memory cells MT based on the write reliability index.

According to this configuration, it is possible to detect whether the write data can be normally read by performing the read verification if the reliability of the write operation is insufficient, and to reduce the number of times of the read verification compared with a case where the read verification is performed on all of the write operations. Accordingly, the throughput of the data writing can be improved. Accordingly, the semiconductor storage device 20 can be better controlled.

At another point of view, if the success or failure of the write operation cannot be determined until the read verification is completed, in preparation for the restoration when an error occurs, the write data is required to be kept in the DRAM 30, until the read verification is completed. In this case, the opening of the DRAM 30 is delayed. As a result, a data buffer that stores the write data becomes substantially less, and the data writing time may become long. However, if whether the read verification is to be performed is determined based on the write reliability index, the execution of the status acquisition command for acquiring the write reliability index is only reading and transmitting a register value in the semiconductor storage device 20, and the execution time is reduced. Therefore, the writing time can be reduced by reducing the read verification.

In the write operation, if the number of software program loops when each threshold voltage distribution is written is larger than the upper limit of the VPS range, there are a certain number of memory cells MT to which writing is harder to proceed than the design ideal value. In contrast, during the write operation, if the number of software program loops when each threshold voltage distribution is written is less than the lower limit of the VPS range, there are a certain number of memory cells MT to which writing is easier to proceed than the design ideal value. These cause the variation in the threshold voltages. Therefore, according to the present embodiment, the first information includes information indicating the number of software program loops performed until the first predetermined condition is satisfied. According to such a configuration, the presence of the memory cells MT to which the writing is hard to proceed or the writing is easy to proceed can be reflected to the write reliability index.

In the write operation, if the number of memory cells MT to which writing is completed when each threshold voltage distribution is written is larger than the VPS count, there are a certain number of memory cells MT to which writing is proceeded than the design ideal value. These occur when the threshold voltage of the memory cells MT is biased toward the high potential side, causes the variation in the threshold voltage. Also, according to the present embodiment, the first information includes the information indicating the number of memory cells MT to which writing is completed before the first predetermined condition is satisfied. According to such a configuration, the presence of the memory cells MT to which the writing is proceeded than the design ideal value can be reflected to the write reliability index.

Second Embodiment

Subsequently, a second embodiment is described. The second embodiment is different from the first embodiment in that a plurality of VPS range count tables T2A, T2B, and T2C are used in accordance with the degree of wear-out of the semiconductor storage device 20. Configurations other than those described below are the same as those in the first embodiment.

FIG. 11 is a diagram showing an example of the VPS range count tables T2A, T2B, and T2C according to the second embodiment. According to the present embodiment, the plurality of VPS range count tables T2A, T2B, and T2C are used in accordance with the degree of wear-out of the semiconductor storage device 20. For example, the VPS range count table T2A is a table corresponding to a case where the semiconductor storage device 20 has a first degree of wear-out. The first degree of wear-out is a small degree of wear-out, and for example, the write/erase cycle (W/E) corresponds to 0 to 300 times. The VPS range count table T2B is a table corresponding to a case where the semiconductor storage device 20 has a second degree of wear-out. The second degree of wear-out is a moderate degree of wear-out, and for example, the write/erase cycle (W/E) corresponds to 301 to 1,500 times. The VPS range count table T2C is a table corresponding to a case where the semiconductor storage device 20 has a third degree of wear-out. The third degree of wear-out is a high degree of wear-out, and for example, the write/erase cycle (W/E) corresponds to 1,501 times or more. For example, write/erase cycle (W/E) is an average value (or a representative value) of the write/erase cycle performed on each block BLK of the semiconductor storage device 20. In the following, if the VPS range count tables T2A, T2B, and T2C is not distinguished, the VPS range count tables T2A, T2B, and T2C are referred to as the VPS range count tables T2.

As shown in FIG. 11, the values of the "VPS range" and the "VPS count" set in accordance with to the second degree of wear-out are higher than the values of the "VPS range" and the "VPS count" set in accordance with the first degree of wear-out. The values of the "VPS range" and the "VPS count" set in accordance with the third degree of wear-out are higher than the values of the "VPS range" and the "VPS count" set in accordance with the second degree of wear-out. The values of the "VPS range" and the "VPS count" are an example of the "first threshold value".

According to the present embodiment, the degree of wear-out (for example, the write/erase cycle) of the semiconductor storage device 20 is managed by the memory controller 10. The memory controller 10 notifies the information indicating the degree of wear-out of the semiconductor storage device 20 to the semiconductor storage device 20. The control circuit 106 of the semiconductor storage device 20 determines the degree of wear-out of the semiconductor storage device 20 based on the information notified from the memory controller 10.

Also, the control circuit 106 determines the values of the "VPS range" and the "VPS count" to be used, based on the determined degree of wear-out of the semiconductor storage device 20. For example, the control circuit 106 selects the VPS range count table T2 corresponding to the determined degree of wear-out of the semiconductor storage device 20, from the VPS range count tables T2A, T2B, and T2C. Also, the control circuit 106 generates the write reliability index by using the values of the "VPS range" and the "VPS count" provided in the selected VPS range count table T2.

As above, according to the present embodiment, the semiconductor storage device 20 generates the write reliability index based on the different threshold value according to the degree of wear-out of the semiconductor storage device 20. Here, if the degree of wear-out of the semiconductor storage device 20 progresses, the number of software program loops at the time of writing or the number of memory cells MT in which the writing is completed is likely to be deviated upward. Therefore, if the threshold value set (the values of the "VPS range" and the "VPS count") is single, and the degree of wear-out of the semiconductor storage device 20 progresses, there are fewer cases where the read verification is reduced, and the reduction effect of the read verification may be reduced. Therefore, a threshold value set is prepared for each degree of wear-out of the semiconductor storage device 20, and the threshold value set to be referred to is changed according to the degree of wear-out, so that the reduction effect of the read verification can be improved.

Third Embodiment

Subsequently, a third embodiment is described. The third embodiment is different from the first embodiment in that a plurality of VPS range count tables T3A and T3B are used in accordance with the position of the word line WL as a writing target. Configurations other than those described below are the same as those in the first embodiment.

FIG. 12 is a diagram showing examples of the VPS range count tables T3A and T3B according to the third embodiment. According to the present embodiment, the plurality of VPS range count tables T3A and T3B are used in accordance with the position of the word line WL as the writing target to the plurality of word lines WL provided in the memory cell array 109. For example, the VPS range count table T3A is a table corresponding to the word line WL of which the ease of writing to the memory cell MT (the ease of increasing the threshold voltage) is the first reference. The word lines WL corresponding to the first reference are, for example, the word lines WL (WL(1 to 94)) other than the word lines WL on both ends, among the plurality of word lines WL provided in the memory cell array 109. The VPS range count table T3B is a table corresponding to the word lines WL of which the ease of writing to the memory cells MT (the ease of increasing the threshold voltage) is the second reference. The word lines WL corresponding to the second reference are, for example, the word lines WL (WL(0, 95)) on both ends among the plurality of the word lines WL provided in the memory cell array 109. In the second reference, the writing to the memory cell MT is easier than that in the first reference (the threshold voltage easily increases). In the following, if the VPS range count tables T3A and T3B are not distinguished, the VPS range count tables T3A and T3B are referred to as the VPS range count table T3.

As shown in FIG. 12, the values of the "VPS range" and the "VPS count" set in accordance with the second reference are higher than the values of the "VPS range" and the "VPS count" set in accordance with the first reference. The values of the "VPS range" and the "VPS count" are an example of the "second threshold value".

According to the present embodiment, the control circuit 106 of the semiconductor storage device 20 determines the values of the "VPS range" and the "VPS count" to be used based on the position of the word line WL as a writing target with respect to the plurality of word lines WL provided in the memory cell array 109. For example, the control circuit 106 selects the VPS range count table T3 corresponding to the position of the word line WL as a writing target based on the address information as the writing destination indicating the word line WL as the writing target. Also, the control circuit 106 generates the write reliability index by using the values of the "VPS range" and the "VPS count" provided in the selected VPS range count table T3.

As above, according to the present embodiment, the semiconductor storage device 20 generates the write reliability index based on the threshold value according to the position of the selected word line WL with respect to the plurality of word lines WL. Here, the semiconductor storage device 20 may have different characteristics depending on the word lines WL, and the number of software program loops during the writing operation for each word line WL or the number of memory cells MT in which the writing is completed may be different. Therefore, if the threshold value set is single, there are fewer cases where the read verification is reduced in the word lines WL with different characteristics, and thus the reduction effect of the read verification may be reduced. Therefore, a plurality of threshold value sets corresponding to the positions of the word lines WL are prepared, and the threshold value sets to be referred to are changed according to the positions of the word lines WL, so that the reduction effect of the read verification can be improved.

Fourth Embodiment

Subsequently, a fourth embodiment is described. The fourth embodiment is different from the first embodiment in that the determination of whether to perform the read verification is performed in the semiconductor storage device 20. Configurations other than those described below are the same as those in the first embodiment.

Figure 13:
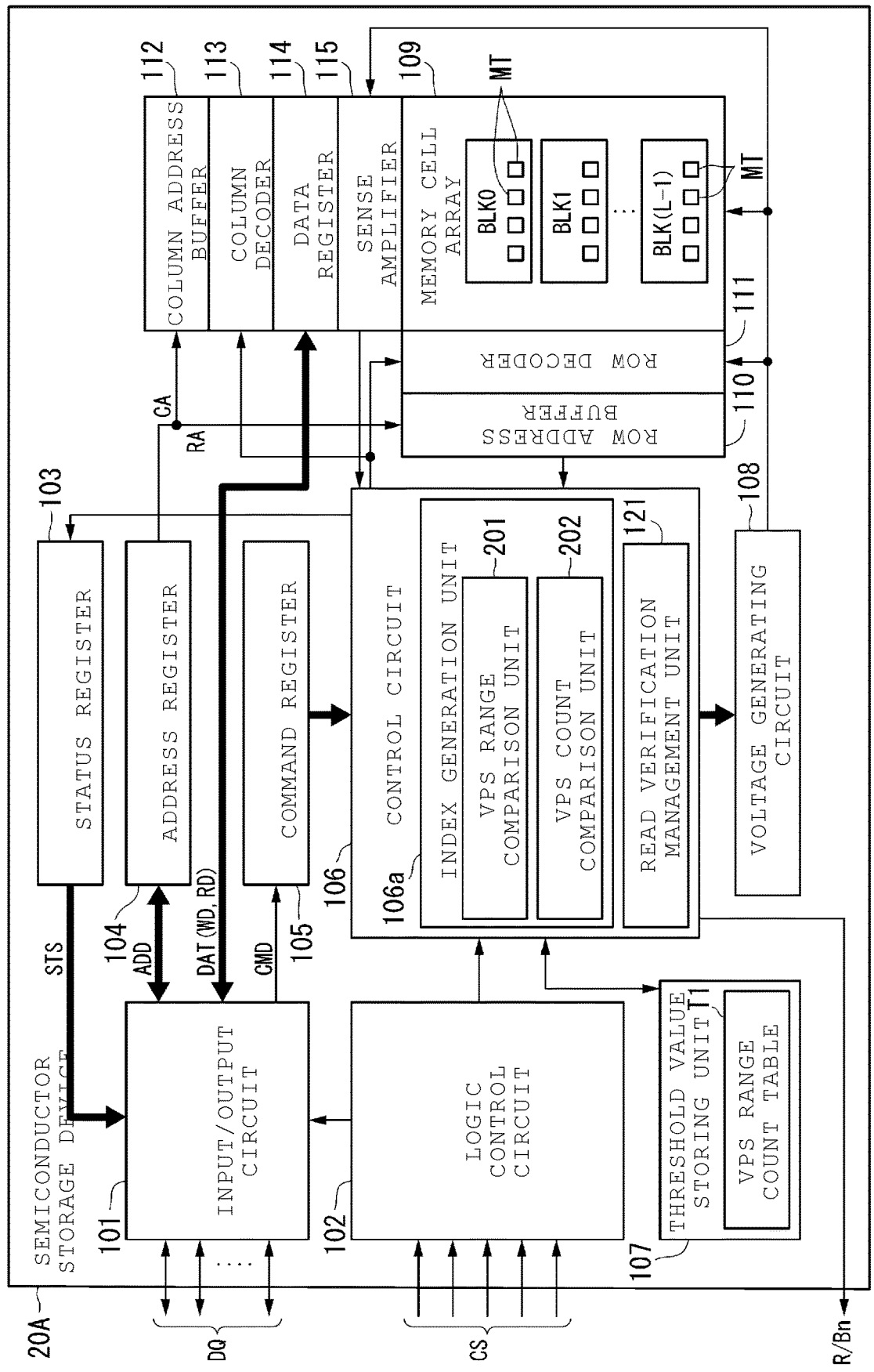
FIG. 13 is a block diagram showing a configuration of a semiconductor storage device according to a fourth embodiment.

FIG. 13 is a block diagram showing the configuration of a semiconductor storage device 20A according to the fourth embodiment. According to the present embodiment, the control circuit 106 includes a read verification managing unit 121. The index generation unit 106a outputs the generated write reliability index to the read verification managing unit 121. The read verification managing unit 121 performs the processes from S201 to S208 described with reference to FIG. 11 in the first embodiment. That is, if the write reliability index is "1", the read verification managing unit 121 skips the read verification. On the other hand, if the write reliability index is "0", the read verification managing unit 121 performs the read verification and verifies whether the write data can be normally read. If it is determined that the write operation is successful, the read verification managing unit 121 sets the status information STS indicating the write operation success to the status register 103.

According to such a configuration, it is not required to determine whether the read verification is to be performed by the memory controller 10, and thus the transmission and reception of signals between the memory controller 10 and the semiconductor storage device 20 can be reduced.

In the above, some embodiments are described. However, the embodiments are not limited to the examples described above. For example, two or more embodiments described above may be combined with each other. For example, the write reliability indices are not limited to two values of "0" and "1", and may be a multi-value. For example, the software program loop may end after being performed only once.

According to at least one embodiment described above, with respect to the write command from the memory controller, the semiconductor storage device performs the program operation of performing the software program loop including applying the write voltage to the word line, performing the program verification of performing write determination of the first data value, and increasing the set value of the write voltage if it is determined that the writing of the first data value is not completed, and generates the index based on the first information obtained according to the progress of writing the first data value in the program operation, and the memory controller determines whether to perform the read verification of reading the data from the plurality of memory cells based on the index. According to such a configuration, the semiconductor storage device can be better controlled.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
   a memory controller; and
   a semiconductor storage device including a plurality of memory cells,
   wherein, if data is written to the plurality of memory cells, the memory controller transmits a write command to the semiconductor storage device, with respect to the write command,
   the semiconductor storage device is configured to:
      perform a program operation including performing a first software program loop until a first predetermined condition is satisfied, wherein the first software program loop includes applying a write voltage to a word line, applying a first verification voltage to the word line to perform program verification for performing write determination of a first data value provided in the data, and increasing a set value of the write voltage if determining that writing of the first data value is not completed;
      generate an index based on first information obtained according to a progress of writing the first data value in the program operation, and
   the memory controller is configured to send a first command for acquiring the index,
   the semiconductor storage device is configured to send the index in response to the first command, and
   the memory controller is configured to receive the index sent from the semiconductor storage device and determine whether to perform read verification of reading data from the plurality of memory cells based on the received index.

2. The memory system according to claim 1, wherein the memory controller is configured to transmit a read command to the semiconductor storage device according to a read request using data of the plurality of memory cells from an external host device, as reading targets, and
   the semiconductor storage device is configured to perform a read operation of reading the data from the plurality of memory cells and transmitting the read data to the memory controller with respect to the read command.

3. The memory system according to claim 2, wherein, if it is determined that the read verification of reading data from the plurality of memory cells is performed based on the received index, the memory controller is configured to transmit the read command to the semiconductor storage device, and
   the semiconductor storage device is configured to perform the read operation with respect to the read command.

4. The memory system according to claim 1, wherein the first information includes information indicating the number of first software program loops performed until the first predetermined condition is satisfied.

5. The memory system according to claim 1, wherein the first information includes information indicating the number of memory cells in which writing is completed before the first predetermined condition is satisfied.

6. The memory system according to claim 1, wherein the program operation includes performing a second software program loop until a second predetermined condition is satisfied, wherein the second software program loop including applying the write voltage to the word line, applying a second verification voltage having a different voltage value from the first verification voltage to the word line to perform program verification for performing write determination of a second data value provided in the data, and increasing a set value of the write voltage if it is determined that writing of the second data value is not completed, and
   the semiconductor storage device is configured to generate the index based on the first information and second information obtained according to a progress of writing the second data value in the program operation.

7. The memory system according to claim 6, wherein the second information includes information indicating the number of second software program loops performed until the second predetermined condition is satisfied.

8. The memory system according to claim 6, wherein the second information includes information indicating the number of memory cells in which writing is completed before the second predetermined condition is satisfied.

9. The memory system according to claim 1, wherein the semiconductor storage device is configured to generate the index based on the first information and a first threshold value, and the first threshold value is determined based on a degree of wear-out of the semiconductor storage device.

10. The memory system according to claim 9, wherein the memory controller is configured to determine the degree of wear-out of the semiconductor storage device and send the degree of wear-out of the semiconductor storage device to the semiconductor storage device.

11. The memory system according to claim 10, wherein the degree of wear-out of the semiconductor storage device is a write/erase cycle of the semiconductor storage device.

12. The memory system according to claim 11, wherein the first threshold value in case where a count of the write/erase cycle of the semiconductor storage device is more than a first value is higher than the first threshold value in case where the count of the write/erase cycle of the semiconductor storage device is or less than the first value.

13. The memory system according to claim 12, wherein the first information includes information indicating the number of first software program loops performed until the first predetermined condition is satisfied.

14. The memory system according to claim 12, wherein the first information includes information indicating the number of memory cells in which writing is completed before the first predetermined condition is satisfied.

15. The memory system according to claim 1, wherein the semiconductor storage device includes a plurality of word lines including the word line, the semiconductor storage device is configured to generate the index based on the first information and a second threshold value, and the second threshold value is determined based on a position of the word line with respect to the plurality of word lines.

16. The memory system according to claim 15, wherein a value of the first threshold value in case where a memory cell connected to the word line with respect to the plurality of word lines is connected to a select transistor is higher than a value of the first threshold value in case where the memory cell connected to the word line with respect to the plurality of word lines is not connected to the select transistor.

17. The memory system according to claim 16, wherein the first information includes information indicating the number of first software program loops performed until the first predetermined condition is satisfied.

18. The memory system according to claim 16, wherein the first information includes information indicating the number of memory cells in which writing is completed before the first predetermined condition is satisfied.

* * * * *